United States Patent [19]

Higgins, III

[11] Patent Number: 4,967,314
[45] Date of Patent: Oct. 30, 1990

[54] CIRCUIT BOARD CONSTRUCTION
[75] Inventor: Leo M. Higgins, III, Lakeville, Mass.
[73] Assignee: Prime Computer Inc., Natick, Mass.
[21] Appl. No.: 430,924
[22] Filed: Nov. 1, 1989

Related U.S. Application Data

[63] Continuation of Ser. No. 173,999, Mar. 28, 1988, abandoned.

[51] Int. Cl.$^5$ ............................................. H05K 1/04
[52] U.S. Cl. ..................................... 361/414; 174/261; 361/410
[58] Field of Search ................. 156/901, 902, 634; 174/252, 250, 255, 261, 262, 264; 361/410, 414, 412, 413

[56] References Cited

U.S. PATENT DOCUMENTS

| | | | |
|---|---|---|---|
| 3,601,523 | 8/1971 | Arndt | 174/68.5 |
| 4,328,531 | 5/1982 | Nagashima | 361/410 |
| 4,383,363 | 5/1983 | Hayakawa et al. | 174/68.5 X |
| 4,501,787 | 2/1985 | Marchetti et al. | 174/68.5 X |
| 4,528,064 | 7/1985 | Ohsawa et al. | 174/68 X |
| 4,538,143 | 8/1985 | Ito | 361/414 X |
| 4,663,497 | 5/1987 | Reimann | 174/68.5 |
| 4,679,122 | 7/1987 | Belke et al. | 361/414 X |
| 4,784,068 | 5/1988 | Fahner et al. | 174/68.5 X |
| 4,827,083 | 5/1989 | Inasaka | 361/414 |

OTHER PUBLICATIONS

L. D. Green, Printed Circuit Packaging, IBM Tech. Disc. Bull., V. #3, #12, May 1961, p. 5.
T. D. Zucconi, Z Direction Pads, IBM Tech. Disc. Bull., V. 21 #2, Jul. 1978, pp. 501 and 502.
Andrew Lovinger, Development of Electrical Conduction in Silver-filled Epoxy Adhesives, J. Adhesion, V. 10, pp. 1–15, (1979) Scotland copy in 252–512.

Primary Examiner—Gerald P. Tolin
Attorney, Agent, or Firm—Wolf, Greenfield & Sacks

[57] ABSTRACT

A high density multi-level printed wiring board having inter-level electrical connections made by via interconnect holes which are drilled or punched through only those layers of the wiring board that separate the two layers containing the conductors which are to be connected and said holes being filled with a low-resistance silver-filled conductive epoxy.

8 Claims, 2 Drawing Sheets

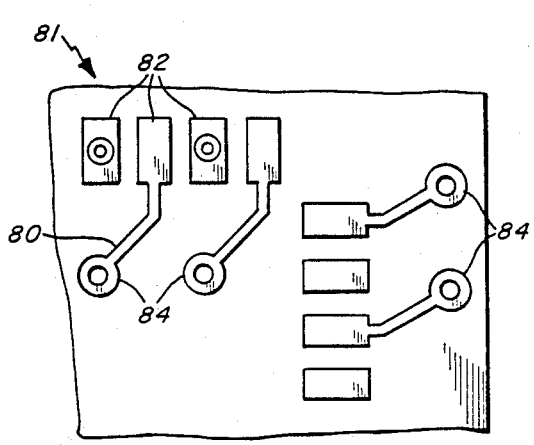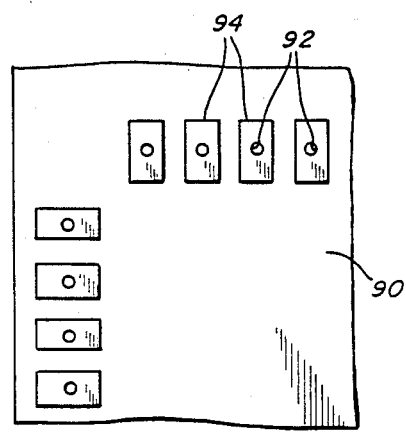
Fig. 3
PRIOR ART
Fig. 4
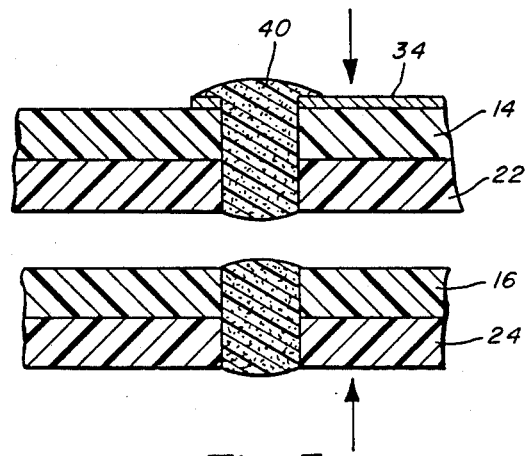
Fig. 5

CIRCUIT BOARD CONSTRUCTION

This application is a continuation of application Ser. No. 07/173,999, filed Mar. 28, 1988, now abandoned.

BACKGROUND OF THE INVENTION

1. Field of the Invention

The present invention relates very generally to circuit board fabrication, and pertains more particularly, to an improved electrical printed circuit board construction and associated method of manufacture thereof.

2. Background Discussion

Printed circuit boards are used extensively in the computer hardware field for constructing electronic circuits. FIG. 1 shows a small section of a typical prior art printed circuit board. Normally, chip carriers, only one of which is shown at 150 in FIG. 1, containing electronic components, are placed on top of the printed wiring board 110 so that the pins 151 of the chip carrier 150 contact corresponding copper pads 126 on the top surface of the board. The board itself usually consists of several levels of circuitry including the top layer. FIG. 1 shows only two of the levels, each level of circuitry actually consisting of two separate physical layers, a laminate layer 112, 114 and a pre-preg layer 120, 122. The laminate layers 112, 114 actually contain the electrical conductors on their surface while the pre-preg layers 120, 122 are typically a "B-staged" or partially cured fiberglass reinforced polymer. The laminate layers are imprinted or etched with copper pads and conductors which form the circuit pattern on each level of circuitry. FIG. 1 shows a pad at 126 and a conductor run at 128. The copper etchings provide the connections for electrical communication within each level of circuitry, however, another means is necessary for providing inter level communication. This is accomplished in the prior art by the use of plated through holes illustrated at 111.

The standard procedure is to stack up all the layers of the printed wiring board and to drill holes through the entire stack up wherever an inter-level connection is desired. Therefore, even if an inter-level connection is needed from only one layer to the next (e.g. layer 112 to layer 114 connecting pad 126 to conductor 128), the hole is drilled through the entire stack-up. The hole is then electro-plated with copper during processing in order to provide an electrical conduction path through the hole. In the layers 112 and 114 which are to be electrically connected by the particular hole 111, copper conductors 126 and 128 contact the hole and carry the electrical signals to their source or destination on the given level. Unfortunately, however, in the remaining levels of circuitry, the copper conductors which are carrying signals to and from other sources and destinations must be routed around holes which were created for inter level conductance in other layers.

The use of plated through holes leads to several other problems and disadvantages. First, copper plating, which takes a significant amount of time, must be performed in a separate step during the processing of the printed wiring board. Also, copper has a different expansion rate when heated than the fiberglass polymer which is used in the pre preg layer. Due to this, plated-through holes are susceptible to cracking with temperature fluctuations.

A further disadvantage of plated-through hole technology is that it places an artificial limit on how small the hole diameters can be. This problem arises due to technical considerations concerning the drill bit size and the electroplating step. The drill bit consideration involves what is called aspect ratio. The aspect-ratio is the ratio between the diameter of the drill bit and the thickness of the material that the bit must drill through. The greater the number of layers that the drill bit must drill through per hole, the shorter the life expectancy of the drill. In other words, a drill of a certain diameter used to drill through two layers per hole will be able to drill through more layers overall before breakage than a drill used to drill through twelve layers per hole. The corollary to this fact is that a drill bit used to drill through fewer layers per hole can have a small diameter yet provide the same lifetime expectancy as a thicker drill which is used for drilling a deeper hole.

The second artificial limit on hole size is the electroplating process. Small diameter holes are much more difficult to electroplate than larger ones. The costs of electroplating increase rapidly as hole diameter decreases.

The problem of hole diameter is illustrated in a typical 50 mm pitch board as shown in FIG. 3. The term 50 mm pitch refers to the fact that the distance between the center of adjacent conductors or adjacent pads is 50 mm. On a typical 50 mm pitch board, the copper pads which provide contacts for the pins of chip carriers are very small, approximately 20 mm by 35 mm. The circuit board designer is faced with the choice of high electroplating costs as well as using a very small diameter drill bit that will need to be replaced frequently or finding some way to provide for larger holes. What is normally done is that a copper conductor 80 is etched on to the board 81 leading from the copper pads 82 to plated-through holes 84 which are placed elsewhere on the board where there is enough room to place the holes on a 100 mm pitch. This is called fanout. Often, the designer makes a compromise in which only half of the pads are fanned out to a 100 mil pitch. The fanned out holes typically have a 35 mm diameter. The remaining holes have diameters of approximately 18 mm and are drilled through every other pad thereby providing holes on a 100 mm pitch. With fanout, not only do the larger holes take up more routing space than is necessary but the copper etches leading from the pad to the holes also occupy valuable routing area. In addition, fanout adds signal length which increases propogation delay as well as noise (cross-talk) vulnerability.

A further disadvantage of the use of larger holes is the fact that fewer etched conductors can be routed between holes. For instance, whereas on a typical 50 mm pitch board, one or two conductor paths can be routed between holes, this number might be increased to three or four copper conductors if not for the artificial limitation on hole diameter. The employment of fanout also limits the density at which surface mounted components may be placed because fanout holes are occupying additional space on the top circuitry layer of the printed wiring board.

Some prior art methods for improving the routing density on printed wiring boards include the use of blind and buried vias. Blind vias are holes selectively drilled only in certain printed wiring board layers and enclosed by the printed wiring board stack up lamination process step. Buried vias simply refer to those blind vias that do not connect to either the top or bottom circuitry level, i.e., that are buried in the stack-up. This process permits the movement of a plated through hole from an undesirable position, but interconnection to the enclosed blind via still must be made by connecting the blind via to a plated through hole. Also, the layers with the blind vias must be predrilled and preplated prior to the lamination step thereby adding further complexity and cost to the fabrication process.

The typical processing of a printed wiring board starts with the step of printing and etching a conductor pattern on each individual printed wiring board laminate layer. The next step is to stack up the laminate layers with pre preg layers in between each laminate layer. The pre-preg layers basically act as a bonding surface between the laminate layers. The through holes are then drilled through the stack up in preparation for copper electroplating. After the separate electroplating step, the board is cured and laminated, completing the process.

Accordingly, it is an object of the present invention to provide an improved circuit board fabrication technique that alleviates the prior art problems outlined above particularly as they relate to plated through holes and printed wiring boards or printed circuit boards.

Another object of the present invention is to provide an improved printed circuit board construction that is of simplified form, that is less expensive than prior art circuit boards and that is substantially unaffected by temperature or other environmental variables.

A further object of the present invention is to provide a new method of constructing inter-level electrical connections in a printed circuit or wiring board, and in particular a method that greatly increases the routing density per unit area.

Still another object of the present invention is to provide a more simplified method for fabrication of printed wiring and/or printed circuit boards.

SUMMARY OF THE INVENTION

The present invention relates to a printed wiring board which eliminates the need for copper-plated through holes and the processing steps involved therein. The present invention eliminates the need for plated through holes by using interconnecting holes that are drilled or punched through only those layers separating the conductor paths that are to be connected. The holes are then filled with an adhesive containing a high concentrate of conductive particles.

The use of this invention provides several advantages over the prior art. It allows for the use of smaller holes as well as the elimination of fanout requirements. It also allows for the placement of surface mounted components at increased density. It further provides more faithful interlayer contact than the blind and buried copper plated vias of the prior art. A further advantage is the ability to use punch bits as opposed to drill bits, which are more expensive, for creating the holes.

The main advantage of this technology is the increased routing density which can be realized. Using the present invention, a circuit can be designed using fewer layers and a smaller board area than in the prior art.

In accordance with one aspect of the present invention there is provided a printed circuit apparatus that is comprised of a plurality of separate circuit boards, each having conductive runs thereon and means for securing the boards in a sandwiched board array. At least adjacently disposed circuit boards are provided with a continuous interconnecting hole defined therein for coupling between the conductive runs that are to be interconnected on separate circuit boards. A curable electrically conductive adhesive, preferably an electrically conductive epoxy, is injected into the interconnecting holes to fill them and to provide, when the adhesive is cured, an electrically conductive bridge between the separate circuit board conductive runs. The separate boards may be comprised of a laminate layer having the conductive run formed thereon by etching and a fiberglass reinforced polymer pre-preg layer.

In accordance with another aspect of the present invention there is described herein a method of fabricating a printed circuit board system from a plurality of separate circuit boards each supporting electrically conductive circuit runs. Each of these circuit boards may be comprised of a laminate layer having the circuit run disposed thereon in combination with a pre-preg layer usually of a reinforced fiberglass material. In accordance with the method there are provided the steps of providing sequentially disposed circuit boards with a continuous interconnecting hole defined therein for coupling between conductive circuit runs on separate circuit boards, and providing a curable electrically conductive adhesive, such as an electrically conductive epoxy that fills the interconnecting hole. The circuit boards are then stacked with the respective interconnecting holes aligned and with the adhesive of adjacent boards in intimate contact. Lastly, is the step of laminating the circuit boards by application of pressure and heat to cure the boards while at the same time completing the curing of the adhesive. In accordance with a preferred embodiment of the present invention the adhesive is partially cured after the hole is filled and before the circuit boards are stacked and laminated Also, it is preferred that the filling step include filling the hole with slightly more adhesive than necessary to fill the hole so that a small adhesive bump is formed at both ends of the hole. When the printed wiring board layers are pressed together in the stack up laminate procedure, the bumps of epoxy are squeezed under pressure and spread out bonding the adjacent layers. This creates an extremely intimate and faithful connection between the epoxy adhesive and the etching of the adjacent layers.

BRIEF DESCRIPTION OF THE DRAWINGS

Numerous other objects, features and advantages of the invention should now become apparent upon a reading of the following detailed description taken in conjunction with the accompanying drawings in which:

FIG. 3 shows a top view of a section of a prior art printed wiring board having fanout to plated through holes;

FIG. 4 shows a top view of a section of a printed wiring board having no fanout, employing the present invention; and FIG. 5 is a fragmentary view illustrating an intermediate step in the fabrication of a printed wiring board in accordance with the present invention.

DETAILED DESCRIPTION

Figure 1:
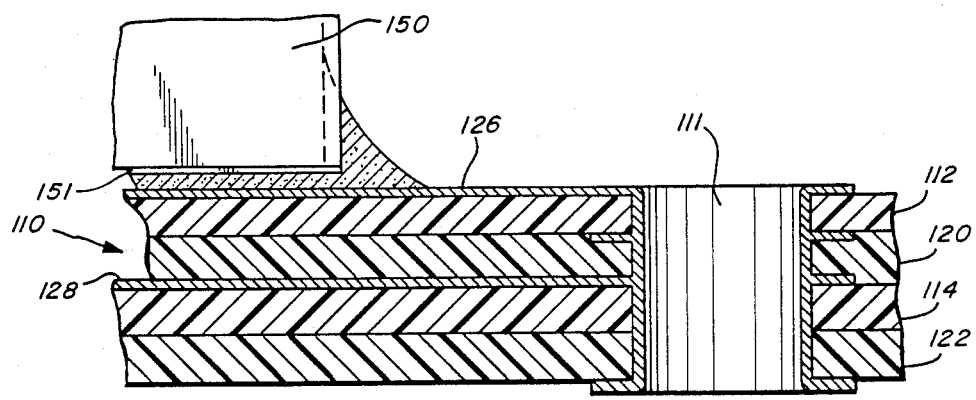
FIG. 1 shows a cross sectional view of a section of a prior art printed wiring board using plated through holes for inter-level electrical connections.
Figure 2:
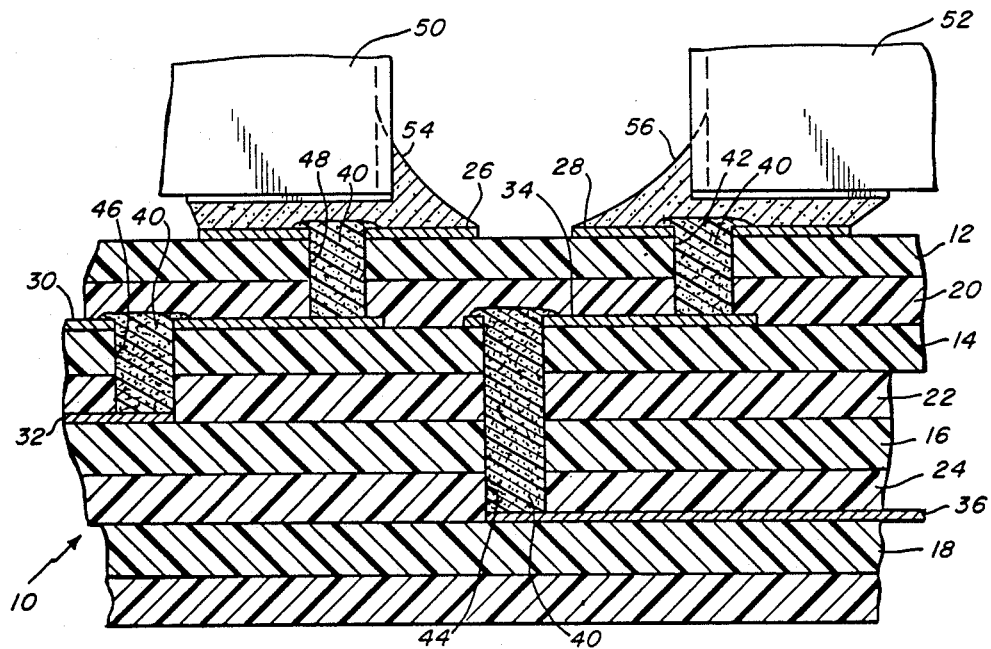
FIG. 2 shows a cross-sectional view of a section of a printed wiring board employing the present invention.

The present invention is used to reduce, or completely eliminate the need for, plated-through holes in printed wiring boards. FIG. 2 shows a cross-sectional view of a section of a printed wiring board embodying the present invention. Two chip carriers 50 and 52 are shown in FIG. 2. The chip carriers are placed on the copper etched contact pads 26 and 28 and are fixed thereto by soldering. The solder joints are shown at 54 and 56, respectively. FIG. 2 shows seven layers of the board, however, the board may contain several more layers and, in fact, normally would. Each level of circuitry is comprised of two layers, a laminate and a pre preg. In the particular embodiment shown in FIG. 2, the laminate layers 12, 14, 16 and 18 are imprinted with circuit patterns while the pre preg layers 20, 22 and 24 are displaced between the laminate layers in order to electrically isolate the laminate layers from each other and to bind the laminate layers together. Pre-preg is typically a B staged or partially cured fiberglass reinforced polymer. The copper etches 26, 28, 30, 32, 34 and 36 which are imprinted on the respective laminate layers, carry electrical signals from source to destination within a given layer. The holes (vias) 42, 44, 46 and 48 carry electrical signals from layer to layer. The vias are basically holes which are either punched or drilled through the layer.

The hole is filled with a conductive paste 40, preferably a silver filled epoxy paste or polymide in order to provide a very low resistance pathway. For best results, the epoxy (or polymide) should contain approximately 80% by weight very fine silver particles suspended therein. A copper filled epoxy paste would also be acceptable, however, resistance would be greater than with a silver epoxy. The paste is of high viscosity.

The aforementioned conductive paste may be a metal filled polymer system. The particular polymer which may be something other than an epoxy is to be compatable with the polymer of the circuit board itself. Teflon is one such polymer that may be used employing metal powder in suspension. The conductive paste that is employed is preferably of thermo-plastic, rather than thermo-setting type.

The step of filling the hole with the conductive paste may be carried out in a number of different ways. A screen printing technique may be employed. Alternately, a foil may be provided that is etched or drilled in a proper pattern with the conductive paste (adhesive) being extruded through the foil with the conductive material passing into the holes in the proper pattern.

It can be seen in FIG. 2 that the vias are not drilled completely through all the layers as in the prior art. In the present invention, it is necessary to drill the via only through the number of layers that separate the layers containing the two copper etches that are to be electrically connected. Therefore, taking via 42 as an example, if it is desired that the signal traveling on the copper etch 28 on the top printed wiring board layer 12 be transferred to the copper conductor 34 on the second layer 14, then the via 42 need be drilled only through the first laminate and pre-preg layers 12, 20. Alternatively, as shown at via 44, if a signal on the second circuitry level (consisting of laminate layer 14 and pre preg layer 22) is to be transferred to the fourth circuitry level (only laminate 18 is shown) then the hole is drilled through two layers of laminate and pre-preg 14, 22, 16, 24. In the prior art technology, whenever inter-layer electrical communication was required, a hole was drilled through all layers of the stack-up regardless of the number of intervening layers between the two communicating conductors. This invention eliminates the waste that is inherent in drilling through layers of laminate and pre-preg for no functional purpose.

The use of this technology leads to several advantages in the printed wiring board field. First, the number of layers for a particular circuit design is reduced in comparison to the prior art since it is no longer necessary to route the copper conductors around the wasted space of non-functional holes. There is simply more routing area on the board because there are fewer holes in each layer. Second, the vias of the present invention may have a much smaller diameter than the plated through holes of the prior art, for reasons that will be explained shortly. Since the vias may be smaller, more conductor paths can be routed between them. Both of these advantages allow for greater routing density, thereby reducing the area of the circuit board needed for a given circuit, as well as the number of layers of circuitry in the board stack-up.

The use of smaller holes provides even greater increases in routing area per board since, in the top circuitry layer, the smaller holes may be drilled directly through the copper pads, thus eliminating fanout requirements. As previously explained, on a typical prior art board using a 50 mm pitch, fanout is necessary to a 100 mm pitch in order to drill the through holes. Not only does this consume routing space on the wiring board, but it also adds signal length which increases propagation delay and noise (cross-talk) vulnerability.

Reference is now made to FIG. 4 for an illustration of a fragment of a circuit board constructed in accordance with the present invention. Since the vias 92 can be smaller, they may be drilled (or punched) directly through the contact pad 94 on the uppermost circuit layer 90, thus eliminating the need for fanout. A further advantage of the elimination of fanout is the fact that surface mounted components may be placed closer together thereby increasing their density on the board.

Some very significant advantages are gained also in the processing and manufacturing of printed wiring boards. The vias in the present invention may be made smaller in diameter because of the reduced number of layers that each via must penetrate. When drilling through printed wiring boards, the lower limit of the diameter of the drill bit is directly related to the number of layers which the drill bit must drive through per hole. The greater the thickness drilled through, the greater diameter the drill bit must have in order to avoid breakage. For example, a drill of a given diameter which is used to drill holes through twelve layers at once will fatigue and break after drilling through only fewer layers than a drill of the same diameter which is used to drill holes through two layers at a time.

It should be noted that, as mentioned above, the electro-plating step, which also imposed a limit on the size of the via in the prior art, has been eliminated. Whereas holes having diameters of approximately 35 mm were typical of the prior art printed wiring boards and holes having 16–25 mm diameters were considered small, the present invention allows holes to have diameters of 1–18 mm. The preferred hole size using this invention is about 8 to 10 mm.

The use of conductor filled epoxy as the inter-level conductors provides further advantages over the use of copper plating. Although copper plating provides satisfactory inter-level connections when using through holes, the use of that technology for inter-layer conducting in the blind vias and buried vias of the present invention provides unsatisfactory electrical connections. In the prior art, all the layers in a given circuit board are stacked up and the through holes are electroplated in one continuous process. In the present invention, the vias in each level of circuitry (constituting a laminate and pre-preg layer) are drilled and filled with epoxy separately due to the fact that vias do not run contiguously through all the layers. During processing, after the vias are drilled and filled, all the printed wiring layers are stacked up, pressed together and laminated. If the vias are electroplated, the contacts between contiguous vias or between the vias and the conductors may become corroded and/or placed imperfectly so that the contact becomes weak, creating noise or completely failing. The use of conductor filled epoxy avoids this fabrication problem.

Using the present invention, the processing of a printed wiring board involves the following steps. The first step is to print and etch the conductor pattern on each individual laminate layer. Next, via inter-connection holes are drilled (or punched) in the laminate layer and corresponding pre-preg layer. At this point, the via holes are filled with the conductor filled paste such that there is slightly more epoxy than is necessary to completely fill the hole. The slight overfilling of the hole creates a slight "bump" at both the top and bottom of the hole. The epoxy will remain in the hole due to its natural adhesion to the sidewalls of the hole as well as its viscosity. A typical conductor-filled epoxy which would be ideal for application in this invention has a viscosity of approximately 100 centipoids. Such a viscosity would be more than adequate for holding the epoxy in place.

In this connection, refer to the fragmentary view of FIG. 5 that shows an intermediate step in the fabrication process of a printed circuit board in accordance with the present invention. This fragmentary view is taken in the area of the via hole 44 as referenced in FIG. 2. Thus FIG. 5 shows the laminate layers 14 and 16 and pre-preg layers 22 and 24.

FIG. 5 illustrates the epoxy at 40 with there being separate segments thereof illustrated associated with each of the separate circuit boards with each circuit board considered as being comprised of respective laminate and pre-preg layers. FIG. 5 illustrates the bump at the end of each of the holes in these circuit boards. Arrows in FIG. 5 also illustrate the subsequent lamination in which the circuit boards are pressed together so as to compress the epoxy 40 to provide an intimate contact. Prior to the stacking of the circuit boards, it is preferred to partially cure the epoxy so that it is maintained properly in the interconnecting hole. In the embodiment of FIG. 5 the single laminate layer and pre-preg layer are shown accepting a single charge of epoxy. In an alternate form of construction the charge of epoxy may be deposited separately in each layer.

In the process of fabrication the next step is to stack all the printed wiring board layers and pre-preg layers in a stack up and laminate. When the printed wiring board layers are pressed together in the stack up laminate procedure, the "bumps" of epoxy are squeezed under pressure and spread out to bond the adjacent layers. This creates an extremely intimate and faithful connection between the epoxy and the copper etching of the adjacent layers. Since the epoxy bonds to the adjacent layer, there is little possibility of corrosion destroying the inter-layer electrical connection.

The stacking and laminating procedure involves the application of heat for curing the layers, particularly the bonding pre-preg layers. The application of heat also cures the epoxy as the epoxy segments are maintained in intimate contact. In this regard the provision of the end bump as illustrated in FIG. 5 is instrumental in maintaining proper contact throughout the epoxy bridge.

Other advantages over the prior art are also gained by using the present invention. For instance, the copper plating process consumes a large amount of time relative to the amount of time that it takes to fill the holes with conductor filled epoxy. Plated-through holes are also susceptible to cracking with temperature fluctuations, due to the dissimilar material expansion rates of copper, and the fiberglass polymer used in the pre-preg. It should be noted at this point that the via fill paste should be chosen to be compatible with the pre-preg layer in terms of curing-cycle time and temperature, in order to avoid the same susceptibility to cracking.

A further advantage of the present invention is that a punch may be used to create the vias as opposed to a drill. Since the thickness that must be punched through is much less than in the case of plated-through holes, a high-speed punch bit can be used instead of a drill, to create the holes. The cost of manufacturing a punch bit is significantly less than the cost of manufacturing a drill bit of the same diameter. This is because the surface of a drill bit must be contoured whereas a punch bit need have only a straight, flat surface.

It is to be understood that the foregoing description is merely a disclosure of particular embodiments and is in no way intended to limit the scope of the invention. Several possible alterations and modifications will be apparent to those skilled in the art. For instance, the thickness of the printed wiring board can be decreased by eliminating the laminate layers and printing and etching the conductor pattern directly on the pre-preg layers. Further, in some applications where via resistance is critical, it may be desirable to copper-plate the vias and then fill them with conductor filled epoxy. Other possible modifications will be apparent to those skilled in the art as all to be defined by the following claims:

What is claimed is:

1. A printer circuit apparatus comprising a plurality of separate circuit board layers, each board layer comprising a laminate layer having conductive runs thereon and a pre-preg layer, means securing the board layers in a sandwiched array, means defining a continuous interconnecting hole in at least two adjacently disposed circuit board layers between at least two conductive runs on separate circuit board layers, and a curable electrically conductive adhesive disposed within said interconnecting hole providing an electric connection bridge between said at least two conductive runs, the interconnecting hole as well as the electrical connection bridge passing only between said at least two conductive runs, wherein one of said at least two conductive runs is disposed on one of said two adjacently disposed circuit board layers and the other of said at least two conductive runs is disposed on a third circuit board layer adjacent to the other of said two adjacently disposed circuit board layers, further wherein said third circuit board layer itself defines no hole in alignment with said interconnecting hole, and further including a fourth circuit board layer adjacent to said one circuit board layer itself defining no hole in alignment with said interconnecting hole.

2. A printed circuit apparatus as set forth in claim 1 wherein said interconnecting hole is a blind hole.

3. A printed circuit apparatus as set forth in claim 1 wherein said separate circuit board layers each are comprised of a laminate layer having the conductive run formed thereon by etching.

4. A printed circuit apparatus as set forth in claim 3 wherein said separate circuit board layers each are also comprised of a fiberglass reinforced polymer pre-preg layer.

5. A printed circuit apparatus as set forth in claim 1 wherein said adhesive comprises an epoxy paste with fine electrically conductive particles suspended therein.

6. A printed circuit apparatus as set forth in claim 5 wherein said particles represent on the order of 80% by weight of the adhesive.

7. A printed circuit apparatus as set forth in claim 5 wherein said particles are selected from a group consisting of silver and copper.

8. A printed circuit apparatus as set forth in claim 1 wherein said hole has a diameter in the range of 1–18 mm.

* * * * *